United States Patent
Ogura et al.

(10) Patent No.: US 7,577,884 B2
(45) Date of Patent: Aug. 18, 2009

(54) MEMORY CIRCUIT TESTING SYSTEM, SEMICONDUCTOR DEVICE, AND MEMORY TESTING METHOD

(75) Inventors: Kiyonori Ogura, Kasugai (JP); Yasunori Murase, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 467 days.

(21) Appl. No.: 10/455,304

(22) Filed: Jun. 6, 2003

(65) Prior Publication Data

US 2003/0212925 A1 Nov. 13, 2003

Related U.S. Application Data

(63) Continuation of application No. PCT/JP00/08721, filed on Dec. 8, 2000.

(51) Int. Cl.
G11C 29/00 (2006.01)
G11C 7/00 (2006.01)
(52) U.S. Cl. .................... 714/718; 365/201
(58) Field of Classification Search ......... 714/718–723; 365/200–201
See application file for complete search history.

(56) References Cited

U.S. PATENT DOCUMENTS 5,844,914 A * 12/1998 Kim et al. .................... 714/718
6,141,765 A * 10/2000 Sherman ..................... 713/400
6,272,588 B1 * 8/2001 Johnston et al. ............. 711/106
6,453,434 B2 * 9/2002 Delp et al. ................... 714/718

FOREIGN PATENT DOCUMENTS

JP 11-086598 3/1999
JP 2000-163997 6/2000

OTHER PUBLICATIONS

"Quality memory blocks-balancing the trade-offs" by Prince, B. IEEE First International Symposium on Quality Electronic Design, 2000. ISQED 2000. Proceedings Publication Date: 2000 on pp. 109-114 Meeting Date: Mar. 20, 2000-Mar. 22, 2000 ISBN: 0-7695-0525-2 INSPEC Accession No. 6622773.*

* cited by examiner

Primary Examiner—Cynthia Britt
(74) Attorney, Agent, or Firm—Arent Fox LLP

(57) ABSTRACT

A semiconductor device that performs refresh tests of a plurality of individual memories built into the same chip and prevents excessive testing during the refresh test. When a first testing circuit enters a wait state, the first testing circuit issues a refresh command REF to a first memory circuit. Then, the first memory circuit refreshes the memory cells until a second testing circuit enters the wait state. That is, since the memory cells of the first memory circuit are refreshed until the writing to a second memory circuit ends, the refresh test time of the first and second memory circuits are the same.

22 Claims, 13 Drawing Sheets

PRIOR ART

PRIOR ART

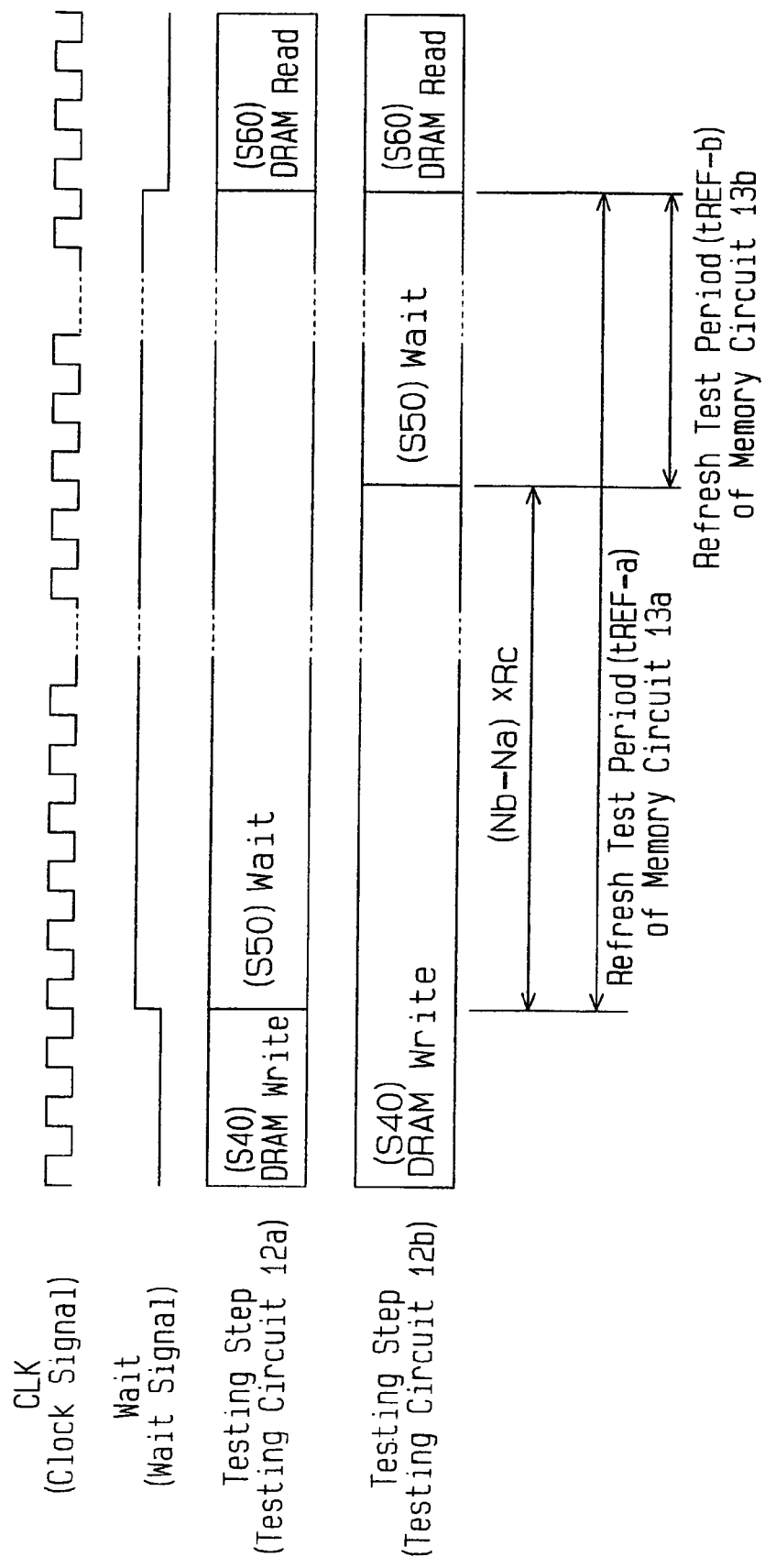

MEMORY CIRCUIT TESTING SYSTEM, SEMICONDUCTOR DEVICE, AND MEMORY TESTING METHOD

CROSS-REFERENCE TO RELATED APPLICATIONS

This application is a continuation of PCT application number PCT/JP00/08721 filed on Dec. 8, 2000.

BACKGROUND OF THE INVENTION

The present invention relates to a memory circuit testing system, a semiconductor device, and a memory testing method, and more specifically relates to a memory circuit testing system including a plurality of memory circuits and a testing circuit on the same chip, in which the testing circuit performs function tests of the memory circuits, a semiconductor device, and a memory testing method.

In recent years, semiconductor integrated circuit devices (LSI), such as ASIC (Application Specific IC) and the like, have become capable of having a plurality of large-capacity memory circuits built into a single chip together with logic circuits to attain high integration and high functionality. In such semiconductor devices, the transmission rate (data quantity transmitted per unit time) between the logic circuits and memory circuits is increased more than in conventional semiconductor devices.

Semiconductor devices are subjected to performance testing to test whether or not the logic circuits and memory circuits are operating properly prior to shipping. These logic circuits and memory circuits each include circuits of function block units having a plurality of logic gates. Therefore, the output condition of the semiconductor device when testing specific function block circuits is affected by the condition of function block circuits other than the one being tested. Furthermore, the pace of improvement of the integration of semiconductor devices increases every year, with the number of installed memory circuits increasing in conjunction with the growing multifunctionality of semiconductor devices, thus making the testing of the function blocks of memory circuits in particular very complex.

Accessing and testing memory circuits directly from an external device has been considered as a method for testing a semiconductor device having a plurality of built-in memory circuits. However, the memory circuit has an input/output terminal connected to a logic circuit. This causes problems, such as difficulty in performing memory circuit input/output from outside the semiconductor device, and an increase in the number of testing terminals.

Therefore, in recent years a built-in self test (BIST) means built into a semiconductor device to perform a memory circuit test and output the test result to an external device has been proposed as a means for simplifying function tests of memory circuits built into a semiconductor device.

Generally, when a plurality of memory circuits are built into the same chip, a testing circuit (BIST) is built in on a one-to-one basis for each memory circuit. That is, a testing circuit is provided for each memory circuit to test the memory circuit. This adequately ensures the accuracy for testing each memory circuit.

FIG. 10 is a block diagram showing an example of the connection between a testing circuit and a memory circuit. The example shows a DRAM (dynamic random access memory) as the memory being tested. A clock signal CLK is provided to the testing circuit 10 and the memory circuit (DRAM macro) 11. A test bit (control signal) TB is also input to the testing circuit 10. Accordingly, a plurality of pairs of testing circuits 10 and memory circuits 11 are built into the same chip, and the testing of all the memory circuits 11 is started simultaneously, with each testing circuit 10 determining the test result of the corresponding memory circuit.

The testing circuit 10 outputs a command control signal, an address signal, and write data generated in response to the test bit TB to the corresponding memory circuit 11. In the testing circuit 10, expected value data (not shown in the drawing) read from the memory circuit 11 is generated. Then, a comparator circuit (not shown in the drawing) of the testing circuit 10 compares the expected value data with the read data having cell information read from the memory circuit 11, and outputs a determination signal to the outside of the device.

The DRAM, which is used as memory, performs a data rewrite operation, i.e., a refresh operation at predetermined time intervals to maintain the data written to the DRAM. Accordingly, the refresh operation must be performed within the time during which the data stored in the DRAM is maintained. In the testing circuit 10, a refresh test is conducted as a test for verifying the data holding time in the DRAM or the like that requires the refresh operation.

FIG. 11 is a flow chart illustrating the refresh test.

The refresh test starts when a clock signal CLK is provided to the testing circuits 10 (step S10). This initializes the testing circuits 10 and the memory circuits (DRAM macro) 11 (step S20 and step S30), and write operations are executed to write data to all of the memory circuits 11 (step S40).

When the write operations for writing data to all of the memory cells in step S40 ends, there is a wait state during which access (read operation) from the testing circuit 10 to the memory circuit 11 is prohibited for a predetermined time (step S50). The time during which access to the memory circuits 11 is prohibited, i.e., the wait state (step S50), is set so as to be equal to the data holding time of the memory circuits 11, and the data holding time is equivalent to a refresh test time tREF (refresh interval).

Thereafter, accessing of the memory circuits 11 is resumed, data is read from the memory circuits 11, and then the read data is compared with the expected value data generated by the comparator circuit to determine whether or not the write data of step S40 is held (step S60).

Then, the determination signal is held or output (step S70).

As described above, the refresh test time tREF is realized by prohibiting access to the memory circuit 11 for a predetermined time period, and the two means described below are provided as examples of means for prohibiting such access.

A first means is to prevent the clock signal CLK from being provided to the testing circuit 10. FIG. 12 is a transition chart of the refresh test.

In this method, after the writing of data to the memory circuit 11 in step S40 ends, access to the memory circuit 11 is prohibited by stopping the clock signal CLK from being provided. Then, the access to the memory circuit 11 is resumed and the wait state (step S50) is ended by providing the clock signal CLK again to the testing circuit 10 and the memory circuit 11.

A second means is to generate a wait signal Wait from the test bit TB input to the testing circuit 10 so as to force the testing circuit 10 into the wait state (step S50). FIG. 13 shows a refresh test transition chart for when the wait signal Wait is used as the test bit TB.

In this method, when the writing of data to the memory circuit 11 ends, the testing circuit 10 enters a wait state (step S50) when the wait signal Wait goes high. Thereafter, the testing circuit 10 ends the wait state (step S50) when the wait signal Wait goes low.

FIG. 14 is a flow chart of the wait state (step S50). The operation descriptions in FIG. 14 are based on hardware description language (VHDL: very high speed IC-hardware description language).

When the wait state is entered (step S50), a determination is made in the testing circuit 10 as to whether or not a clock signal CLK is being provided to the testing circuit 10 and the memory circuit 11 (step S51).

Next, in a state in which the clock signal CLK is held, a determination is made as to whether or not the wait signal Wait is high or low (step S52). At this time, when the wait signal Wait is high, the testing state is maintained in the wait state (step S50). However, when the wait signal Wait is low, the wait state (step S50) ends.

Generally, a plurality of memory circuits built into the same chip have address spaces (memory capacity) that differ in size in accordance with the specifications of the built-in logic circuits.

FIG. 15 is a transition chart of the refresh test when two sets of testing circuits 12a and 12b and memory circuits (DRAM macros) 13a and 13b are built into the same chip. The address spaces of the memory circuits 13a and 13b are Na and Nb (Na<Nb), respectively.

When the wait signal Wait goes high at the same time as when the writing to the memory circuit 13a ends, the testing circuit 12a enters the wait state in response to the high wait signal Wait. At this time, since the address space Na and Nb of the memory circuits 13a and 13b are different, there is a difference in the time for writing data to the memory circuits 13a and 13b. That is, the writing operation to the memory circuit 13b is performed continuously.

Next, when the writing to the memory circuit 13b ends, the testing circuit 12b enters the wait state in response to the high wait signal Wait.

Subsequently, the wait states of the testing circuits 12a and 12b end simultaneously when the wait signal Wait goes low after a refresh test time tREF-b of the memory circuit 13b elapses. Accordingly, the refresh test time tREF-a of the memory circuit 13a is longer than the refresh test time tREF-b of the memory circuit 13b.

Since the memory circuits 13a and 13b have the same cell configuration, they have the same data holding time. Accordingly, both testing circuits 12a and 12b must have the same refresh test time during which the testing circuits 12a and 12b waits.

When, however, the address spaces Na and Nb of the memory circuits 13a and 13b are different (Na<Nb) as described above, and the basic cycle time for the refresh test time of the testing circuits 12a and 12b is represented by Rc, a time difference is generated in the writing times ((Nb−Na) *Rc).

Accordingly, in the conventional testing circuits 12a and 12b, the refresh test time tREF-a of the memory circuit 13a becomes excessive by time ((Nb−Na)*Rc) from the refresh test time tREF-b of the memory circuit 13b. Therefore, a problem arises inasmuch as the data holding time of the memory circuit 13a cannot be confirmed.

It is an object of the present invention to provide a memory circuit testing system capable of realizing a refresh test of a plurality of memories built into the same chip via a common control signal, and to prevent excessive refresh testing.

SUMMARY OF THE INVENTION

A first aspect of the present invention provides a memory circuit testing system, a semiconductor device, and a memory testing method. The memory circuit testing system includes a plurality of memory circuits and a plurality of testing circuits corresponding to the plurality of memory circuits, each testing circuit sequentially executing a first testing state for writing data to the corresponding memory circuit, a second testing state for waiting until a release signal is input, and a third testing state for reading data from each memory circuit. The second testing state is provided with a refresh function for performing a refresh operation on the corresponding memory circuit until the first testing state ends in all of the plurality of testing circuits.

A second aspect of the present invention provides a memory circuit testing system, a semiconductor device, and a memory testing method. The semiconductor device includes a plurality of memory circuits and a plurality of testing circuits corresponding to the plurality of memory circuits, each testing circuit sequentially executing a first testing state for writing data to the corresponding memory circuit, a second testing state for waiting until a release signal is input, and a third testing state for reading data from each memory circuit. The second testing state is provided with a refresh means for performing a refresh operation on each corresponding memory circuit until the first testing state ends for all of the plurality of testing circuits.

A third aspect of the present invention provides a memory circuit testing system, a semiconductor device, and a memory testing method. The memory testing method tests a plurality of memory circuits with a plurality of testing circuits respectively corresponding to the plurality of memory circuits. The plurality of testing circuits each sequentially execute a first testing state for writing data to the corresponding memory circuit, a second testing state for waiting until a release signal is input after a refresh operation is performed on the corresponding memory circuit before the first testing state ends for all testing circuits, and a third testing state for reading data from each memory circuit.

BRIEF DESCRIPTION OF THE DRAWINGS

FIG. 15 is a transition chart of a conventional refresh test.

DETAILED DESCRIPTION OF THE PREFERRED EMBODIMENTS

A first embodiment of the memory circuit testing system of the present invention is described hereinafter with reference to FIGS. 1 through 4.

Figure 1:
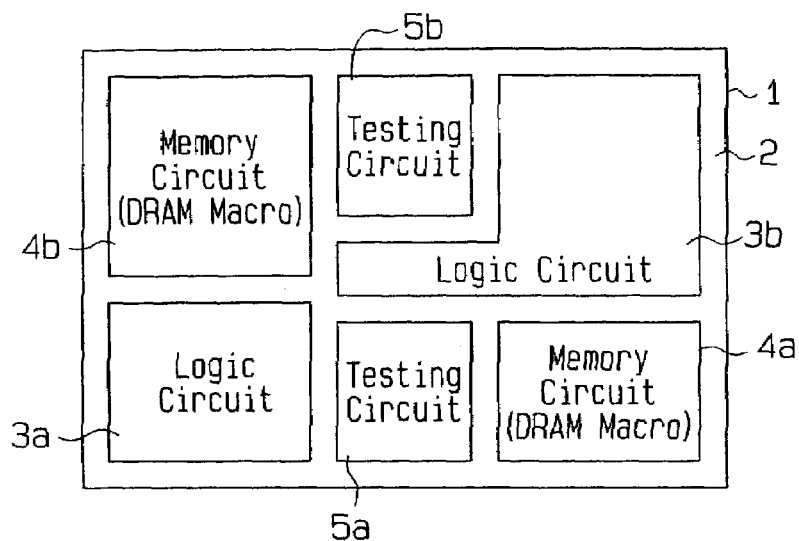
FIG. 1 is a plan view schematically showing a semiconductor device according to a first embodiment of the present invention.

FIG. 1 is a schematic plan view of a semiconductor device.

A semiconductor device 1 is a mixed DRAM and logic LSI having a chip 2, on which are provided first and second logic circuits 3a and 3b, and plural sets (e.g., two sets shown in FIG. 1) of first and second memory circuits 4a and 4b and first and second testing circuits 5a and 5b. In the example given in the present embodiment, the memory subject to testing is an SDRAM (synchronous dynamic random access memory). Furthermore, the first and second memory circuits 4a and 4b have address spaces of different size (determined by memory capacity and word configuration), for example, the address space of memory circuits 4a and 4b is represented by Na and Nb (where Na<Nb).

Figure 2:
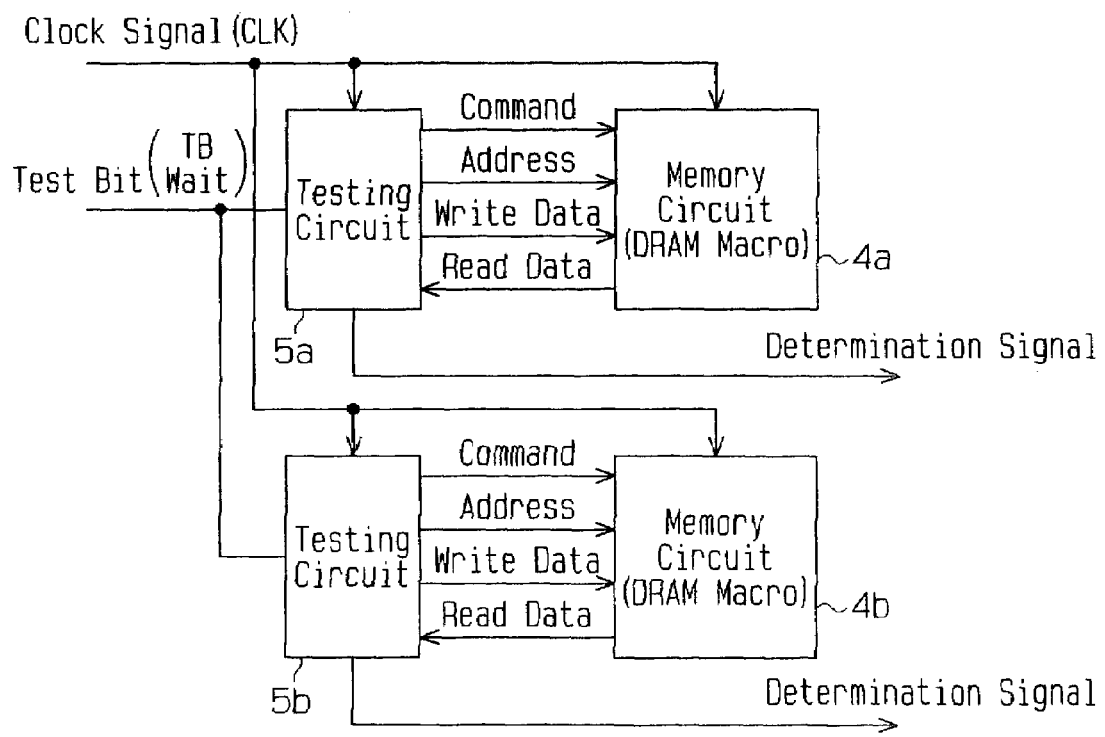
FIG. 2 is a block diagram showing an example of a connection between two sets of memory circuits and testing circuits in the first embodiment of the present invention.

FIG. 2 is a block diagram showing an example of the connection between the two sets of the first and second memory circuits (DRAM macro) 4a and 4b and the first and second testing circuits 5a and 5b on the same chip 2.

A common clock signal CLK is provided to each of the testing circuits 5a and 5b and the memory circuits 4a and 4b from a testing device (not shown), which is connected to the semiconductor device 1. Furthermore, a common test bit (control signal) TB is input from the testing device to each of the testing circuits 5a and 5b. The test bit TB includes a plurality of signals including a wait signal Wait, which will be described later. Accordingly, testing of each memory circuit 4a and 4b starts simultaneously, and the test results are determined by the corresponding testing circuits 5a and 5b.

The testing circuits 5a and 5b output command control signals, address signals, and write data, which are generated in response to the test bit TB, to the corresponding memory circuits 4a and 4b. The testing circuits 5a and 5b generate expected value data (not shown in the drawing), which is read from the memory circuits 4a and 4b. Then, a comparator circuit (not shown) of each testing circuit 5a and 5b compares the expected value data and the read data containing cell information read from each memory circuit 4a and 4b and outputs a determination signal to an external device.

Figure 3:
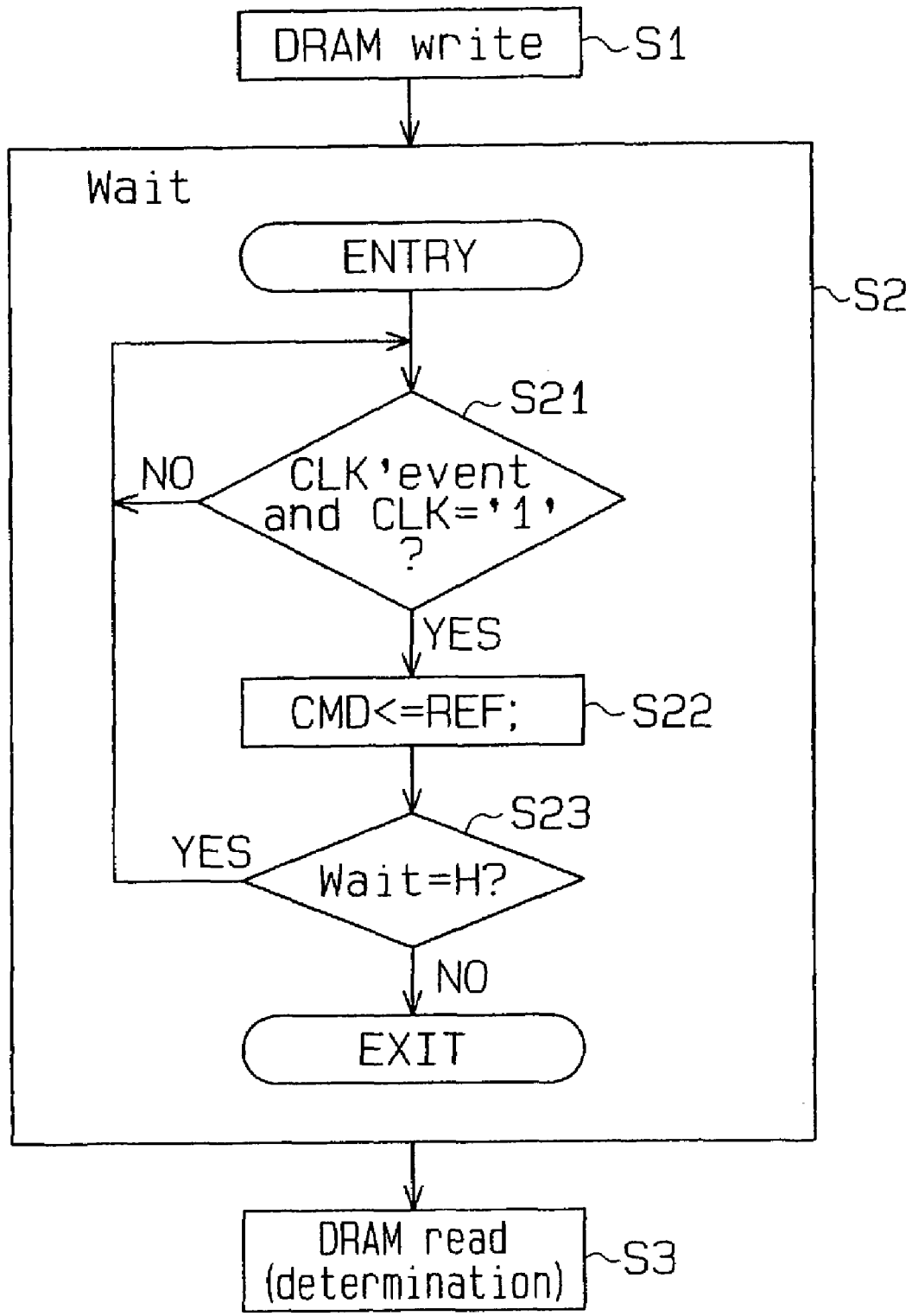
FIG. 3 is a flow chart illustrating testing with the testing circuits in the first embodiment of the present invention.

FIG. 3 is a flow chart illustrating the testing conditions. The operation descriptions in FIG. 3 comply with the hardware description language, VHDL (very high speed IC-hardware description language).

The test includes DRAM writing as a first test state (step S1), a waiting state as a second test state (step S2), and DRAM reading (determination) as a third test state (step S3).

In the DRAM write (step S1), each of the testing circuits 5a and 5b write the generated write data to the memory cells of the memory circuits 4a and 4b.

After data has been written to all of the memory cells, the operating state of each testing circuit 5a and 5b shifts to their respective wait states (step S2) in response to the wait signal Wait, which is included in the test bit (control signal) TB.

The wait state (step S2) is a state in which accessing (reading operation) of the memory circuits 4a and 4b by the testing circuits 5a and 5b is prohibited with the wait signal Wait.

More specifically, when the writing to each memory circuit 4a and 4b ends during DRAM writing (step S1), each of the testing circuits 5a and 5b enter a wait state (step S2) in which accessing of the memory circuits 4a and 4b is prohibited when the wait signal Wait goes high. When the wait signal Wait goes low from this state, the wait state (step S2) ends and accessing of the memory circuits 4a and 4b is restarted, and the operating state transitions from the aforesaid state to DRAM reading (step S3).

During DRAM reading (step S3), the comparator circuits compare the data read from the memory circuits 4a and 4b with the expected value data generated by the testing circuits 5a and 5b. Then, a determination is made as to whether or not the write data of the DRAM writing (step S1) is being held.

When predetermined conditions are fulfilled in the wait state (step S2), the testing circuits 5a and 5b have the function of executing refresh operations on the memory circuits 4a and 4b. In the present embodiment, the wait state (step S2) is a loop flow including step S21, step S22, and step S23, as shown in FIG. 3. That is, each testing circuit 5a and 5b has a means (step S22) for issuing a refresh command REF to the memory circuits 4a and 4b.

Operation in the wait state (step S2) is described below with reference to the loop flow of FIG. 3.

As described above, when the writing to the memory circuits 4a and 4b in DRAM writing (step S1) ends, the testing circuits 5a and 5b are forced to a wait state (step S2) in response to the high wait signal Wait.

Next, a determination is made as to whether or not a clock signal CLK is provided to the testing circuits 5a and 5b and the memory circuits 4a and 4b (step S21).

When the clock signal CLK is provided, the testing circuits 5a and 5b issue a refresh command REF (step S22), and the memory circuits 4a and 4b that have received the refresh command REF refresh the memory cells.

Then, a determination is made as to whether or not the wait signal Wait is high or low (step S23). When the wait signal Wait is low at this time, the testing circuits 5a and 5b end the wait state (step S2) and shifts to DRAM reading (step S3).

When the wait signal Wait is high, the testing circuits 5a and 5b are maintained in the wait state. Then, in step S22, the memory circuits 4a and 4b continue the refresh operations by receiving the refresh command REF again. That is, the clock signal CLK is held for the memory circuits 4a and 4b which have started the refresh operation, and the refresh operation continues while the wait signal Wait is held at the high level.

Figure 4:
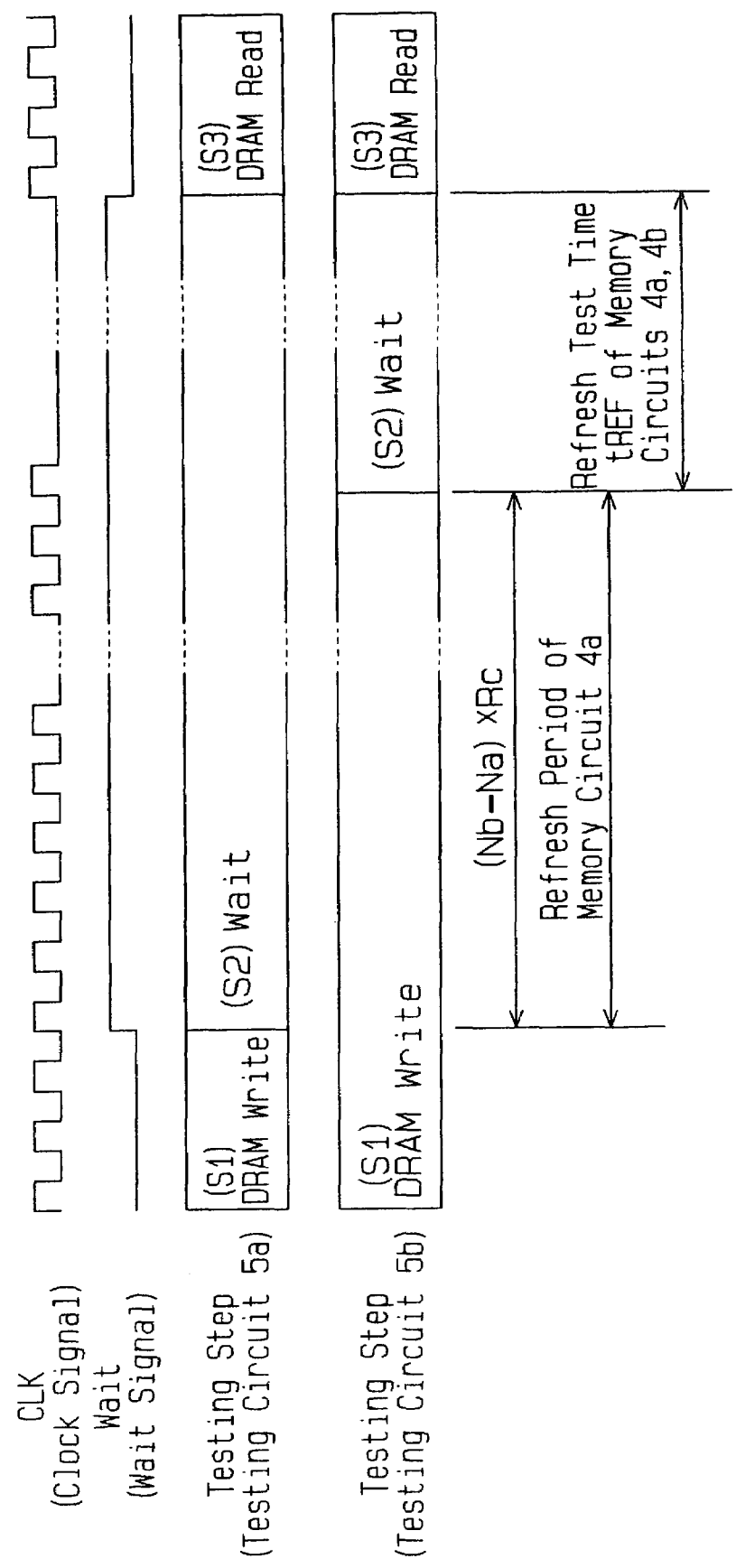
FIG. 4 is a transition chart of the refresh test in the first embodiment of the present invention.

FIG. 4 is a transition chart of the refresh test.

When the clock signal CLK is provided to the first and second testing circuits 5a and 5b and the memory circuits 4a and 4b to start testing, the testing circuits 5a and 5b write data to the memory circuits 4a and 4b during DRAM writing (step S1).

Next, when the writing to the first memory circuit 4a ends, the first testing circuit 5a enters the wait state (step S2) in response to the high wait signal Wait.

Since the size of the address spaces Na and Nb of the first and second memory circuits 4a and 4b are different (Na<Nb), a time difference ((Nb−Na)*Rc) is generated between the time in which data is written to the memory circuit 4a and the time in which data is written to the memory circuit 4b. Rc is the basic cycle time of the refresh test of each memory circuit 4a and 4b. Therefore, the clock signal CLK is provided to both memory circuits 4a and 4b even after the writing to the first memory circuit 4a ends until the writing to the second memory circuit 4b ends.

Accordingly, the first testing circuit 5a issues the refresh command REF to execute a refresh operation on the first memory circuit 4a.

Next, when the writing to the second memory 4b ends, the testing device stops providing the clock signal CLK. Then, the first testing circuit 5a stops the refresh command REF to the first memory circuit 4a to end the refresh operation of the first memory circuit 4a.

After the data holding time of the first and second memory circuits 4a and 4b elapses, i.e., after the refresh test time tREF of the first and second memory circuits 4a and 4b elapses, the testing device starts providing the clock signal CLK and causes the wait signal Wait to go low. Then, in response to the restarted clock signal CLK and the low wait signal WAIT, the first and second testing circuits 5a and 5b determine whether or not the write data are maintained in DRAM reading (step S3) and output the determination result.

Features of the memory circuit testing system, the semiconductor device, and the memory testing method of the first embodiment of the present invention are described below.

(1) When the first testing circuit 5a enters the wait state (step S2), the first testing circuit 5a issues a refresh command REF to the first memory circuit 4a. Then, the first memory circuit 4a refreshes the memory cells until the second testing circuit 5b enters the wait state (step S2). That is, since the memory cells of the first memory circuit 4a are refreshed until the writing to the second memory circuit 4b ends, the refresh test time tREF of the first and second memory circuits 4a and 4b is the same. Therefore, excessive testing in the refresh test time tREF of the first memory circuit 4a is prevented. Accordingly, simultaneous execution of high-precision refresh tests becomes possible for a plurality of memories (DRAM), and the memory data holding time is accurately ensured prior to shipping the semiconductor device.

(2) The wait signal Wait is commonly input to the first and second testing circuits 5a and 5b. That is, the distribution area is reduced because the refresh testing of a plurality of memories (DRAM) is enabled by a common control signal.

(3) Testing of the first and second memory circuits 4a and 4b is performed simultaneously by using the common wait signal Wait input to the first and second testing circuits 5a and 5b. Accordingly, a semiconductor device that reduces testing time is provided.

(4) Since the memory circuits 4a and 4b, which are the test subjects, are embodied in SDRAMs, high-speed operation testing is possible because the memory circuits 4a and 4b operate synchronously by means of the clock signal CLK.

A second embodiment of the memory circuit testing system of the present invention is described below with reference to FIGS. 5 and 6.

This embodiment is a partial modification of the structure of the first and second testing circuits 5a and 5b in the first embodiment, and step S22 in the testing wait state (step S2) shown in FIG. 3 is modified. Accordingly, like structural parts are designated by like reference numbers, and detailed description of these like parts is omitted.

Figure 5:
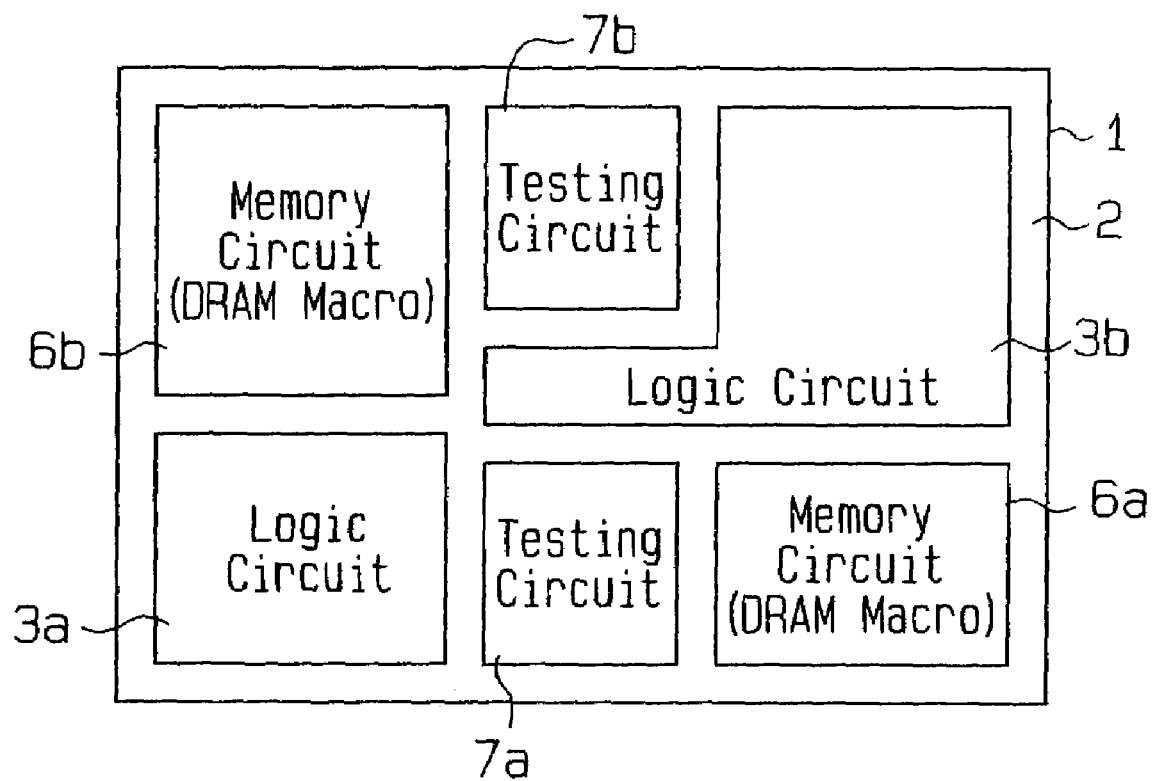
FIG. 5 is a plan view schematically showing the semiconductor device according to a second embodiment of the present invention.

FIG. 5 is a schematic plan view of a semiconductor device.

The semiconductor device 1 includes a chip 2, on which are provided logic circuits 3a and 3b, and plural sets (such as the two sets shown in FIG. 5) of first and second memory circuits 6a and 6b and first and second testing circuits 7a and 7b. In the example given in the present embodiment, the memory subject to testing is an SDRAM. Furthermore, the first and second memory circuits 6a and 6b have address spaces of different sizes, for example, the address space of memory circuits 6a and 6b may be respectively designated Na and Nb (where Na<Nb).

Such an example of the connection between the two sets of the first and second memory circuits (DRAM macro) 6a and 6b and the first and second testing circuits 7a and 7b on the same chip 2 is shown in the block diagram of FIG. 2. Accordingly, in the same manner as in the first embodiment, testing of each memory circuit 6a and 6b starts simultaneously and the test results are determined by the corresponding testing circuits 7a and 7b.

Figure 6:
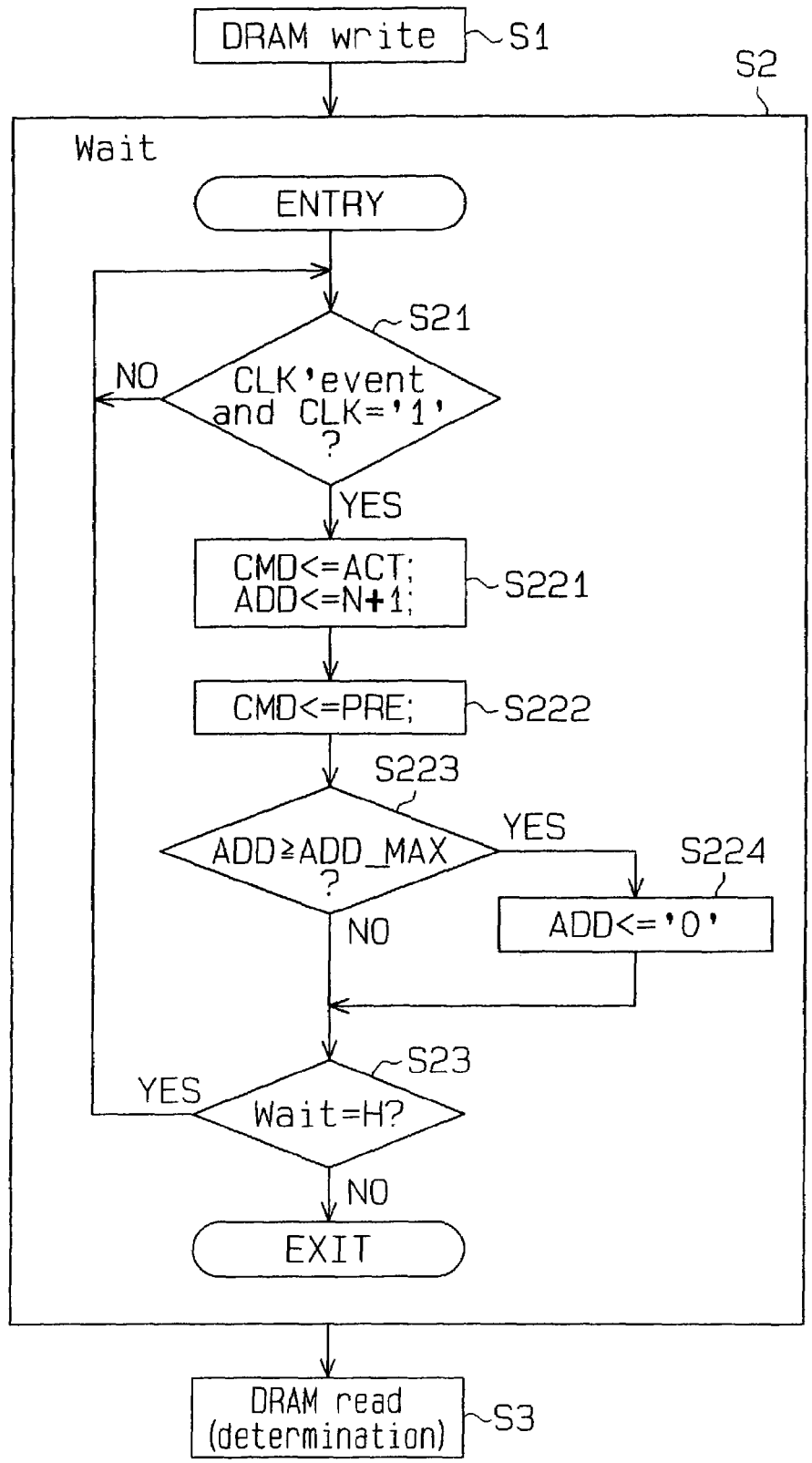
FIG. 6 is a flow chart illustrating testing with the testing circuits in the second embodiment of the present invention.

FIG. 6 is a flow chart illustrating the testing conditions. The operation descriptions in FIG. 6 comply with the hardware description language, VHDL.

The test performed by the testing circuits 7a and 7b includes DRAM writing (step S1), a wait state (step S2), and DRAM reading (determination) (step S3).

The testing circuits 7a and 7b have the function of executing a refresh operation on the corresponding memory circuits 6a and 6b when predetermined conditions are fulfilled in the wait state (step S2). In the present embodiment, the wait state (step S2) is a loop flow including step S21, steps S221 through S224, and step S23, as shown in FIG. 6. That is, the testing circuits 7a and 7b have a means (steps S221 through S224) for executing a refresh operation on the corresponding memory circuits 6a and 6b.

Operation in the wait state (step S2) is described below with reference to the loop flow of FIG. 6.

As described above, when the writing to the first and second memory circuits 6a and 6b in the DRAM write (step S1) ends, the first and second testing circuits 7a and 7b are forced to the wait state (step S2) when the wait signal Wait goes low.

Next, determination is made as to whether or not the clock signal CLK is provided to the testing circuits 7a and 7b and the memory circuits 6a and 6b (step S21).

When the clock signal CLK is provided, the testing circuits 7a and 7b issue an active command ACT and an incremented address ADD to the corresponding memory circuits 6a and 6b (step S221).

Then, the testing circuits 7a ands 7b issue a precharge command PRE to the corresponding memory circuits 6a and 6b (step S222). Subsequently, the memory circuits 6a and 6b refresh the memory cells of the address ADD.

Next, a determination is made as to whether or not the address ADD incremented in step S221 exceeds a maximum address value ADD_MAX stored in test circuits 7a and 7b (step S223).

When the address ADD exceeds the maximum address value ADD_MAX, '0' is input as a minimum address value in the address ADD (step S224).

Then, when the clock signal CLK has been provided, a determination is made as to whether or not the wait signal Wait is high or low (step S23). When the wait signal Wait is low at this time, the testing circuits 7a and 7b end the wait state (step S2) and proceed to DRAM reading (step S3).

When the wait signal Wait is high, the testing circuits 7a and 7b maintain the wait state. Then, in steps S221 and S222, an incremented address ADD is re-issued so that the memory circuits 6a and 6b continue refresh operations. That is, the clock signal CLK is held for the memory circuits 6a and 6b which have started the refresh operation, and the refresh operation continues while the wait signal Wait is maintained at the high level.

Accordingly, when the refresh test is executed in the testing performed by the first and second testing circuits 7a and 7b, the transition chart is the same as in FIG. 4 of the first embodiment. The first memory circuit 6a refreshes the memory cells until the writing to the second memory circuit 6b ends. After the writing to the second memory circuit 6b ends and the clock signal CLK is stopped so that the refresh test time tREF of the first and second memory circuits 6a and 6b are the same, the corresponding testing circuits 7a and 7b output a determination as to whether or not the write data is held.

Features of the memory circuit testing system, the semiconductor device, and the memory testing method of the second embodiment of the present invention are described below.

When a refresh test is performed on the memory circuits 6a and 6b, which have not been provided with a function to respond to the refresh command REF, the same advantages as those of the first embodiment are obtained. Further, the surface area of the logic circuits 3a and 3b built into the chip 2 can be increased because a function for responding to the refresh command REF is not provided in the memory circuits 6a and 6b.

A third embodiment of the memory circuit testing system of the present invention is described below with reference to FIGS. 7 and 8.

This embodiment is a partial modification of the configuration of the first and second testing circuits 5a and 5b in the first embodiment, and step S22 in the testing wait state (step S2) shown in FIG. 3 is modified. Accordingly, like structural parts are designated by like reference numbers, and detailed description of these like parts is omitted.

Figure 7:
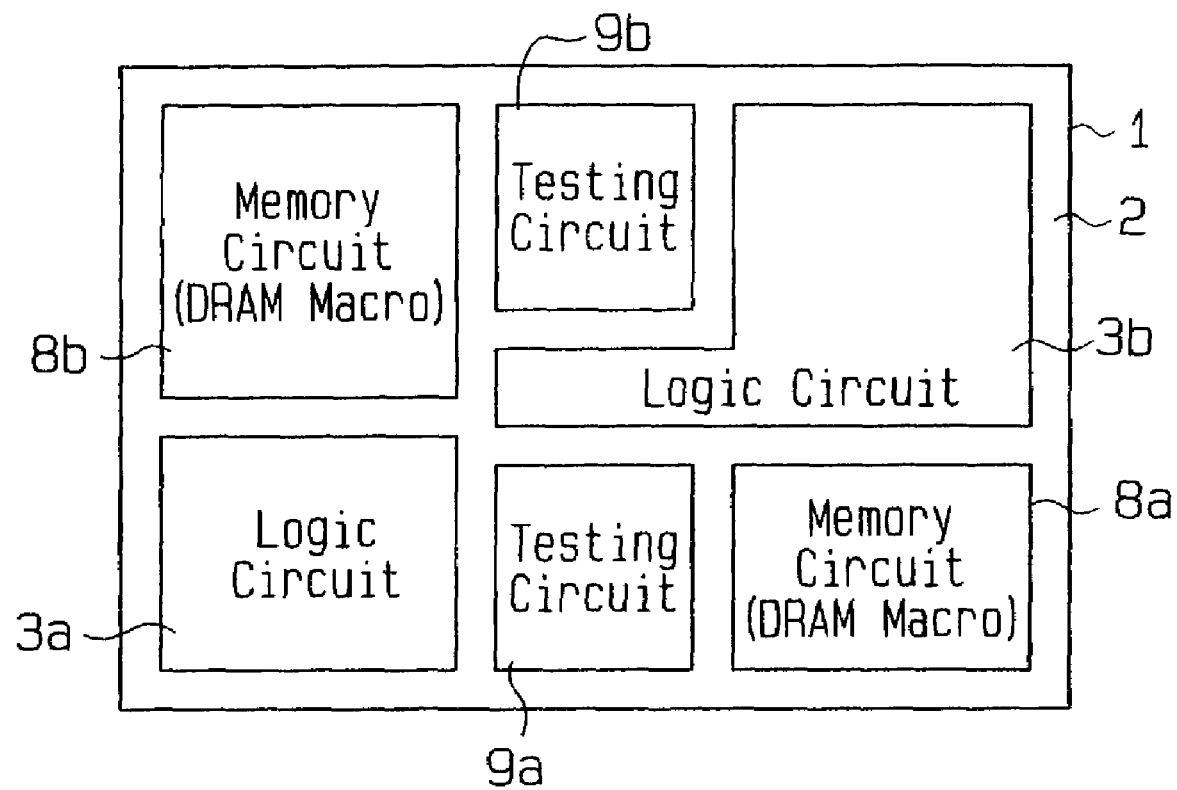
FIG. 7 is a plan view schematically showing the semiconductor device according to a third embodiment of the present invention.

FIG. 7 is a schematic plan view of a semiconductor device.

The semiconductor device 1 includes a chip 2, on which are provided logic circuits 3a and 3b and plural sets (such as the two sets shown in FIG. 7) of first and second memory circuits 8a and 8b and first and second testing circuits 9a and 9b. In the example given in the present embodiment, the memory subject to testing is an SDRAM. Furthermore, the first and second memory circuits 8a and 8b have address spaces of different sizes, for example, the address space of memory circuits 8a and 8b may be respectively designated Na and Nb (where Na<Nb).

In this way, an example of the connection between the two sets of the first and second memory circuits (DRAM macro) 8a and 8b and the first and second testing circuits 9a and 9b on the same chip 2 is shown in the block diagram of FIG. 2. Accordingly, testing of each memory circuit 8a and 8b starts simultaneously, and the test results are determined by the corresponding testing circuit 9a and 9b in the same manner as in the first embodiment.

Figure 8:
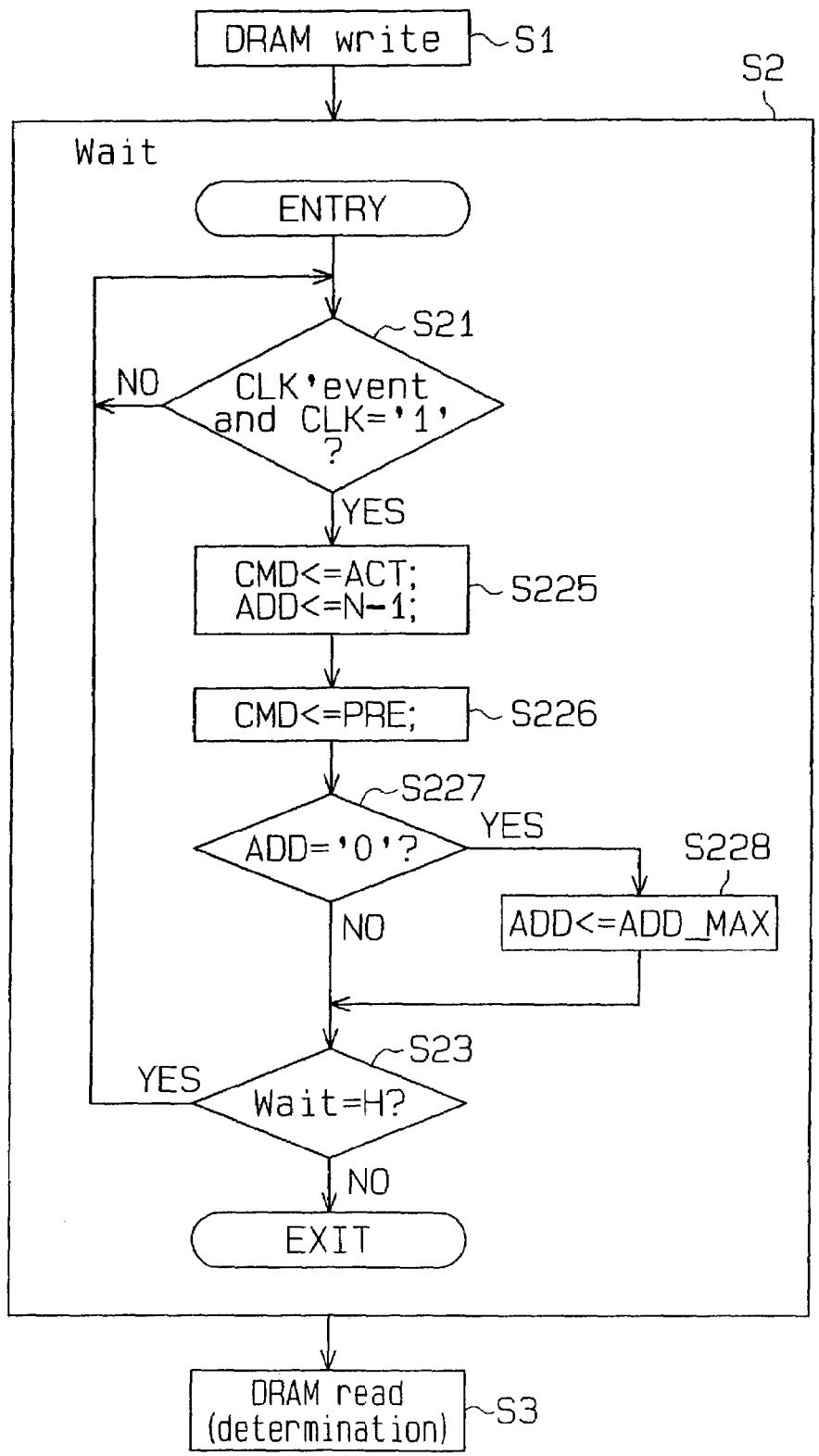
FIG. 8 is a flow chart illustrating the testing by the testing circuits in the third embodiment of the present invention.

FIG. 8 is a flow chart illustrating the testing conditions. The operation descriptions in FIG. 8 comply with the hardware description language, VHDL.

The test performed by the testing circuits 9a and 9b includes DRAM writing (step S1), a wait state (step S2), and DRAM reading (determination) (step S3).

The testing circuits 9a and 9b have the function of executing a refresh operation on the corresponding memory circuits 8a and 8b when predetermined conditions are fulfilled in the wait state (step S2). In the present embodiment, the wait state (step S2) is a loop flow including step S21, steps S225 through S228, and step S23, as shown in FIG. 8. That is, each testing circuit 9a and 9b has a means (steps S225 through S228) for executing a refresh operation on the corresponding memory circuits 8a and 8b.

Operation in the wait state (step S2) is described below with reference to the loop flow of FIG. 8.

As described above, when the writing to the first and second memory circuits 8a and 8b during DRAM writing (step S1) ends, the first and second testing circuits 9a and 9b are forced to the wait state (step S2) when the wait signal Wait goes high.

Next, a determination is made as to whether or not a clock signal CLK is provided to the testing circuits 9a and 9b and the memory circuits 8a and 8b (step S21).

When the clock signal CLK is provided, the testing circuits 9a and 9b issue an active command ACT to the corresponding memory circuit 8a and 8b and issue a decremented address ADD (step S225).

Then, the testing circuits 9a and 9b issue a precharge command PRE to the corresponding memory circuits 8a and 8b (step S226). Subsequently, the memory circuits 8a and 8b refresh the memory cells of the address ADD.

Next, a determination is made as to whether or not the address ADD decremented in step S225 is '0' (minimum address) (step S227).

When the address ADD is '0', the maximum address value ADD_MAX stored in the testing circuits 9a and 9b is input to the address ADD (step S228).

Then, when the clock signal CLK has been provided, a determination is made as to whether or not the wait signal Wait is high or low (step S23). When the wait signal Wait is low at this time, the testing circuits 9a and 9b end the wait state (step S2) and shift to DRAM reading (step S3).

When the wait signal Wait is high, the testing circuits 9a and 9b are maintained in the wait state. Then, in steps S225 and S226, a decremented address ADD is re-issued so that the memory circuits 8a and 8b continue the refresh operations. That is, the clock signal CLK is held for the memory circuits 8a and 8b, which have started the refresh operation, and the refresh operation continues while the wait signal Wait is held at a high level.

Accordingly, when the refresh test is executed in the testing performed by the first and second testing circuits 9a and 9b, the transition chart is the same as in FIG. 4 of the first embodiment. That is, the first memory circuit 8a refreshes the memory cells until the writing to the second memory circuit 8b ends. When the writing to the second memory circuit 8b ends and the clock signal CLK is stopped, and after the refresh test time tREF of the first and second memory circuits 8a and 8b have been executed simultaneously, the corresponding testing circuits 9a and 9b output a determination as to whether or not the write data is being held.

Features of the memory circuit testing system, the semiconductor device, and the memory testing method of the third embodiment of the present invention are described below.

When a refresh test is performed on the memory circuits 8a and 8b, which have not been provided with a function to respond to the refresh command REF, the same advantages as that of the first embodiment can be obtained. The area of the logic circuits 3a and 3b built into the chip 2 may be increased because a function for responding to the refresh command REF is not provided in the memory circuits 8a and 8b.

The aforesaid embodiments may be modified as described below.

The refresh test of the memory circuits 4a and 4b including the refresh operation by the testing circuits 5a and 5b of the above embodiment also may be applied to a disturbance test performed on the memory cells of specific addresses. In such tests, the memory circuit subject to testing is specifically limited to a DRAM.

Although the above embodiments is applied to a test in which two sets of memory circuits 4a and 4b and testing circuits 5a and 5b are built into the same chip 2, the test may also be performed when there are three or more sets.

Although SDRAMs are used as the memory circuits 4a and 4b in the above embodiments, DRAMs also may be used.

In the above embodiments, a plurality of memory circuits having different circuit configurations also may be used in accordance with the specifications of the logic circuits 3a and 3b built into the same chip 2 of the semiconductor device 1.

Figure 9:
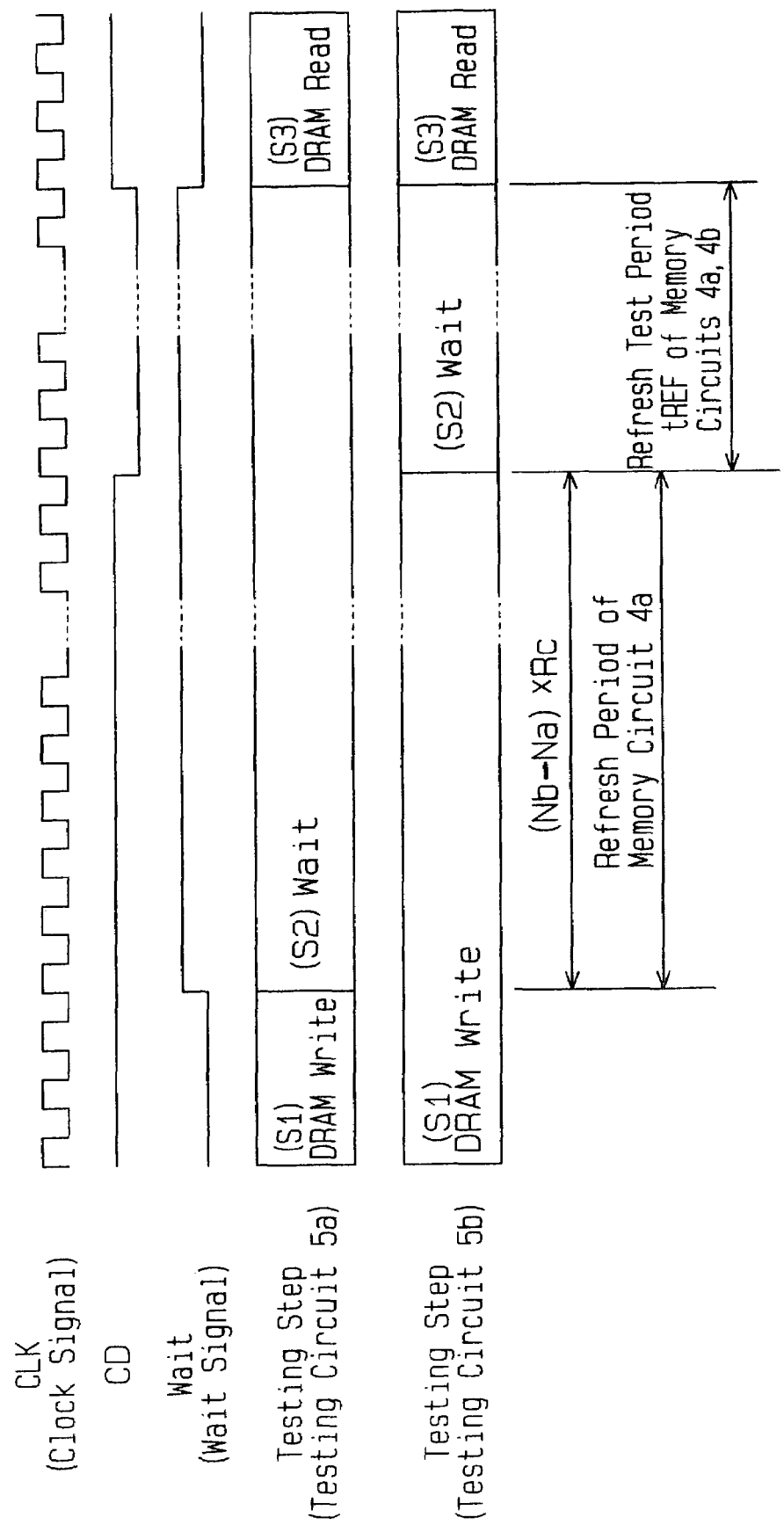
FIG. 9 is a transition chart of another example of the refresh test in the first embodiment of the present invention.
Figure 10:
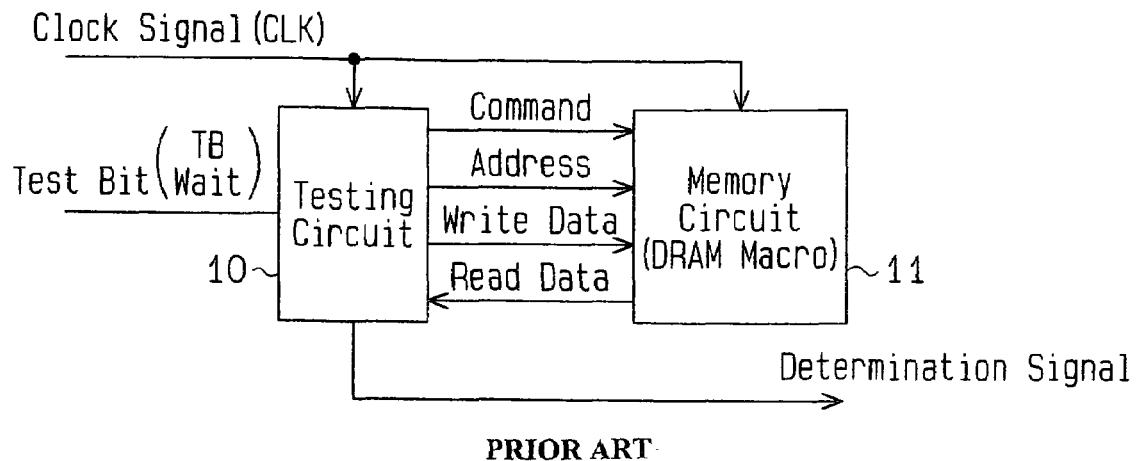
FIG. 10 is a block diagram showing an example of a connection between a memory circuit and a testing circuit.
Figure 11:
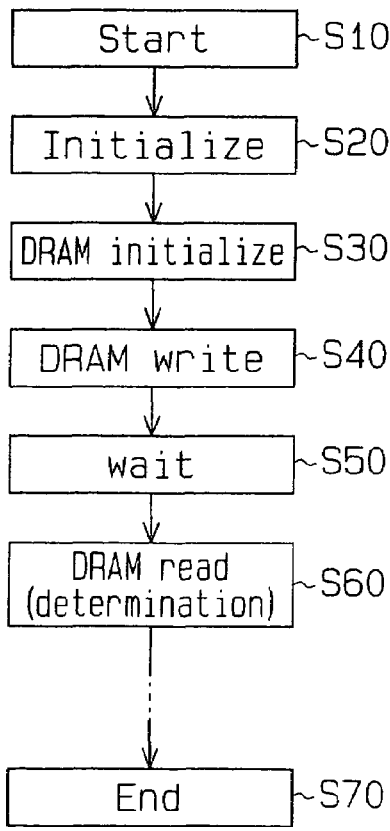
FIG. 11 is a flow chart illustrating testing with the testing circuit.
Figure 12:
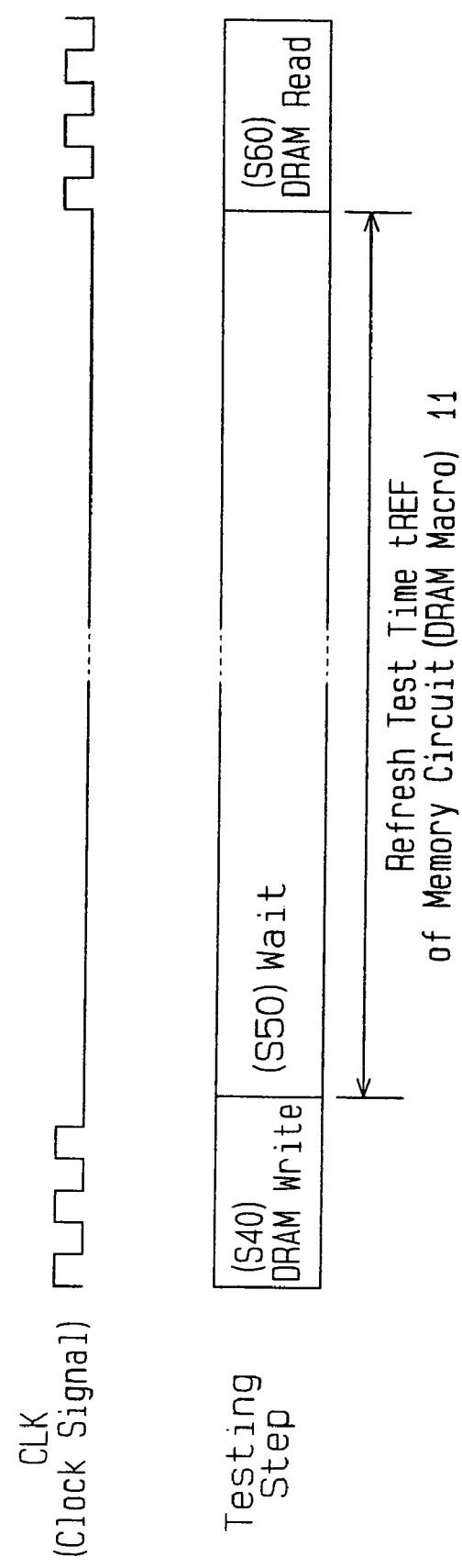
FIG. 12 is a transition chart of a conventional refresh test.
Figure 13:
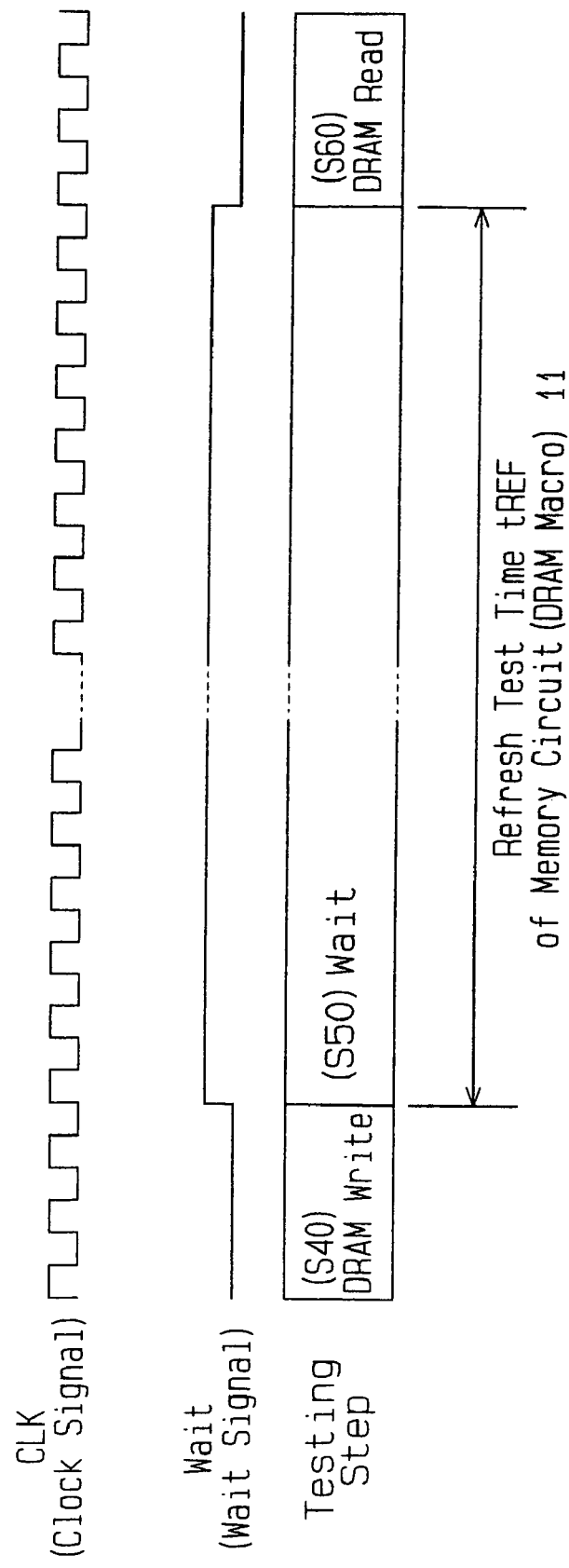
FIG. 13 is a transition chart of a conventional refresh test.
Figure 14:
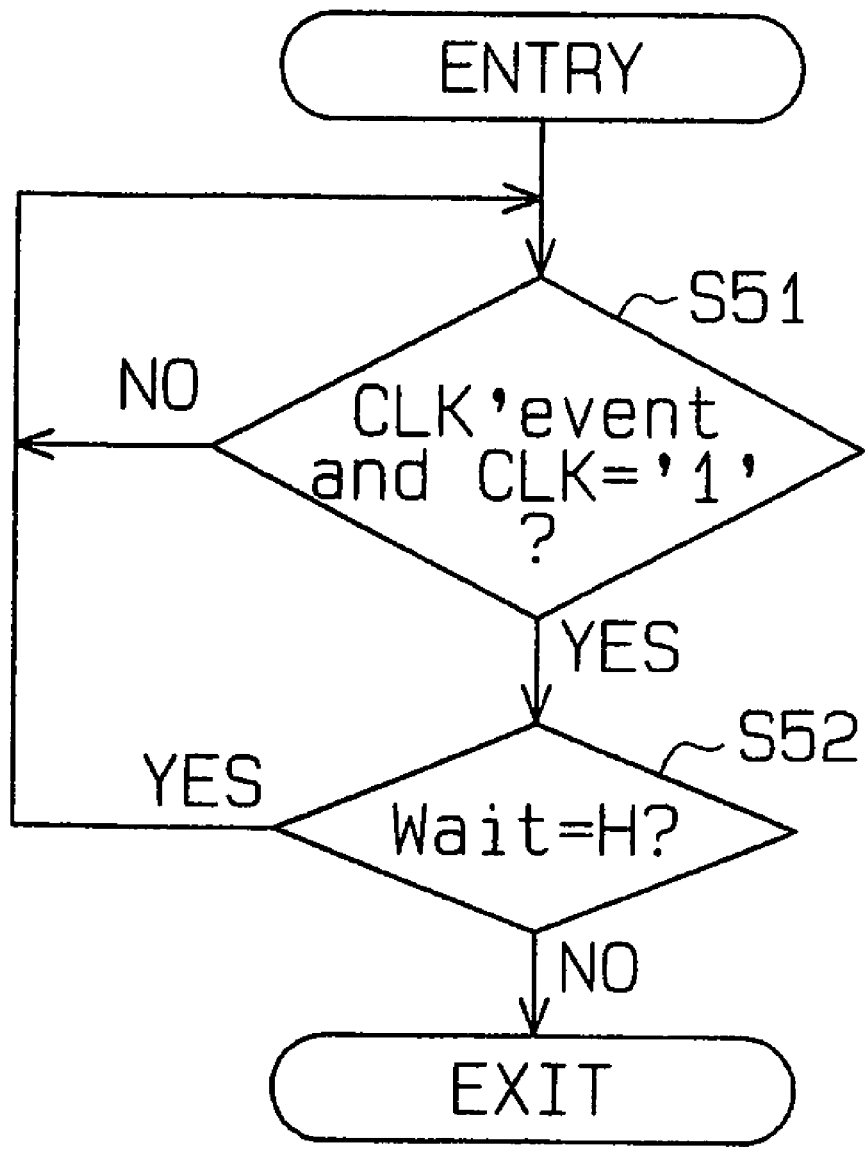
FIG. 14 is a flow chart illustrating a wait state in the test conducted by the conventional testing circuit.

In each of the above embodiments, a common clock signal CLK is input to the testing circuits 5a and 5b and the memory circuits 4a and 4b. However, the clock signal CLK may be input only to the testing circuits 5a and 5b. In this instance, the clock signal CLK and another external signal (control signal) are input together to the testing circuits 5a and 5b, and an output signal of a logic gate, the input signal of which includes the clock signal CLK and the external signal, is input to the memory circuits 4a and 4b. For example, FIG. 9 shows a transition chart of a refresh test when an AND circuit is provided in the testing circuits 5a and 5b, and the clock signal CLK and an external signal CD are input to the AND circuit. The output signal of the AND circuit is input to the memory circuits 4a and 4b. In this instance, the clock signal CLK is not provided to the memory circuits 4a and 4b when the refresh test of the memory circuits 4a and 4b is conducted without stopping the clock signal CLK.

What is claimed is:

1. A memory circuit testing system comprising:
   a plurality of memory circuits; and
   a plurality of testing circuits corresponding to the plurality of memory circuits, each testing circuit sequentially executing a first testing state for writing data to the corresponding memory circuit, a second testing state for waiting until a release signal is input and performing a refresh test for verifying a data holding time, and a third testing state for reading data from each memory circuit, wherein each of the plurality of testing circuits includes a refresh function for performing a refresh operation on a memory circuit,
   wherein, in the plurality of testing circuits, a testing circuit, which completes the first testing state before another testing circuit ends the first testing state, performs the refresh operation while the another testing circuit performs the first testing operation, and
   wherein when the plurality of testing circuits ends the first testing state, the plurality of testing circuits, which includes the testing circuit performing the refresh operation, starts executing the second testing state.

2. The memory circuit testing system according to claim 1, wherein the refresh function issues a refresh command to the memory circuit.

3. The memory circuit testing system according to claim 1, wherein the refresh function performs the refresh operation on the corresponding memory circuit based on a clock signal and a wait signal.

4. The memory circuit testing system according to claim 1, wherein the second testing state includes:
   a first function for determining whether a clock signal is provided;
   a second function for performing a refresh operation on the corresponding memory circuit when the clock signal is input; and
   a third function for determining a wait signal and ending execution or executing the first function.

5. The memory circuit testing system according to claim 1, wherein the refresh function includes:
   a maximum address storage sub-function for storing a maximum address of the memory circuit;
   an active command sub-function for issuing an active command to the memory circuit;
   an address issuing sub-function for outputting an address that is incremented or decremented to the memory circuit;
   a precharge command sub-function for issuing a precharge command to the memory circuit; and
   an address determination sub-function for setting the address as the maximum address or a minimum address of the memory circuit when the address is greater than or equal to the maximum address or less than or equal to a minimum address.

6. The memory circuit testing system according to claim 5, wherein the second testing state includes:
   a first function for determining whether a clock signal is being provided;
   a second function for issuing an active command and an address that is incremented or decremented for the corresponding memory circuit when the clock signal is input;
   a third function for issuing a precharge command to the memory circuit and refreshing a memory cell at the address;
   a fourth function for determining whether or not the address is greater than or equal to a maximum address or less than or equal to a minimum address;
   a fifth function for inputting the minimum address or the maximum address to the address when the address is greater than or equal to the maximum address or less than or equal to the minimum address; and
   a sixth function for determining the level of a wait signal and ending execution or executing the first function.

7. The memory circuit testing system according to claim 1 wherein each testing circuit is provided with a clock signal control for invalidating a clock signal input to the plurality of memory circuits.

8. A semiconductor device including:
   a plurality of memory circuits; and
   a plurality of testing circuits corresponding to the plurality of memory circuits, each testing circuit sequentially executing a first testing state for writing data to the corresponding memory circuit, a second testing state for waiting until a release signal is input and performing a refresh test for verifying a data holding time, and a third testing state for reading data from each memory circuit, wherein each of the plurality of testing circuits includes a refresh means for performing a refresh operation on a memory circuit,
   wherein, in the plurality of testing circuits, a testing circuit, which completes the first testing state before another testing circuit ends the first testing state, performs the refresh operation while the another testing circuit performs the first testing operation, and
   wherein when the plurality of testing circuits ends the first testing state, the plurality of testing circuits, which include the testing circuit performing the refresh operation, starts executing the second testing state.

9. The semiconductor device according to claim 8, wherein the refresh means issues a refresh command to the memory circuit.

10. The semiconductor device according to claim 8, wherein the refresh means performs the refresh operation on the corresponding memory circuit based on a clock signal and a wait signal.

11. The semiconductor device according to claim 8, wherein the second testing state includes:
    a first means for determining whether a clock signal is being provided;
    a second means for performing a refresh operation on the corresponding memory circuit when the clock signal is input; and
    a third means for determining the wait signal and ending execution or executing the first means.

12. The semiconductor device according to claim 8, wherein the refresh means includes:
    a maximum address storage means for storing a maximum address of the memory circuit;
    a means for issuing an active command to the memory circuit;
    an address issuing means for outputting an address that is incremented or decremented to the memory circuit;
    a means for issuing a precharge command to the memory circuit; and an address determination means for setting the address as the maximum address or the minimum address of the memory circuit when the address is greater than or equal to the maximum address or less than or equal to the minimum address.

13. The semiconductor device according to claim 12, wherein the second testing state includes:
   a first means for determining the clock signal;
   a second means for issuing the active command and the address that is incremented or decremented to a corresponding memory circuit when the clock signal is input;
   a third means for issuing a precharge command to the memory circuit and refreshing a memory cell at the address;
   a fourth means for determining whether or not the address is greater than or equal to the maximum address or less than or equal to the minimum address;
   a fifth means for inputting the maximum address or the minimum address to the address when the address is greater than or equal to the maximum address or less than or equal to the minimum address; and
   a sixth means for determining the level of a wait signal and ending execution or executing the first means.

14. The semiconductor device according to claim 8, wherein the semiconductor device comprises a mixed memory and logic circuit.

15. A memory testing method for testing a plurality of memory circuits with a plurality of corresponding testing circuits, the method comprising sequentially executing with each of the testing circuits:
   a first testing state with each of the testing circuits for writing data to the corresponding memory circuit;
   a second testing state for waiting until a release signal is input and performing a refresh test for verifying a data holding time after a refresh operation has been performed for each memory circuit corresponding to at least one testing circuit that executes the second testing state until the first testing state has ended for all of the testing circuits; and
   a third testing state for reading data from each memory circuit,
   wherein, in the plurality of testing circuits, a testing circuit, which completes the first testing state before another testing circuit ends the first testing state performs the refresh operation while the another testing circuit performs the first testing operation, and
   wherein, when the plurality of testing circuits ends the first testing state, the plurality of testing circuits, which includes the testing circuit performing the refresh operation, starts executing the second testing state.

16. The memory testing method according to claim 15, further comprising using each memory testing circuit to sequentially execute:
   determining whether a clock signal is being provided the second testing state;
   performing a refresh operation on the corresponding memory circuit when the clock signal is input; and
   determining the level of a wait signal and based on the level determined ending performance of the refresh operation or performing said determining whether a clock signal is being provided.

17. The memory testing method according to claim 15, further comprising using each testing circuit to sequentially execute:
   determining whether a clock signal is being provided in the second testing state;
   issuing an active command and an address that is incremented or decremented address for the corresponding memory circuit when the clock signal is input;
   issuing a precharge command to the memory circuit and refreshing a memory cell at the address;
   determining whether or not the address is greater than or equal to a maximum address or less than or equal to a minimum address;
   inputting the maximum address or the minimum address to the address when the address is greater than or equal to the maximum address or less than or equal to the minimum address; and
   determining the level of a wait signal and ending performance of the refresh operation or executing said determining whether a clock signal is being provided.

18. A method for testing a plurality of memory circuits with a plurality of testing circuits corresponding to the plurality of memory circuits, wherein the memory circuits have different capacities, the method comprising:
   writing data to each memory circuit using its respective testing circuit;
   refreshing each memory circuit after the data has been written thereto until said writing data has been completed for all of the memory circuits to perform a refresh test for verifying a data holding time; and
   reading data from each memory circuit after said writing data has been completed for all of the memory circuits,
   wherein, in the plurality of testing circuits, a testing circuit, which completes the writing data before another testing circuit ends the writing data, performs a refresh operation while the another testing circuit performs the writing data, and
   wherein, when the plurality of testing circuits ends the writing, the plurality of testing circuits, which includes the testing circuit performing the refresh operation, starts executing the refreshing.

19. The method of claim 18, wherein said refreshing includes:
   determining whether a clock signal is being input to each testing circuit;
   while the clock signal is being input, performing refresh operations on the corresponding memory circuit;
   determining the level of a wait signal;
   based on the level determined for the wait signal, ending said determining whether a clock signal is being input.

20. The method of claim 18, further comprising determining the level of a wait signal, and continuing to perform said refreshing while the wait signal is at one level, and stopping said refreshing when the wait signal is at another level.

21. The method of claim 18, further comprising comparing data as read from said reading data with an expected value for the data.

22. The method of claim 18, wherein said writing data completes for at least one of the memory circuits prior to another memory circuit due to the different capacities between memory circuits, and said refreshing continues for said at least one of the memory circuits at least until said writing completes for said another memory circuit.

* * * * *